(12) United States Patent
Matsunaga et al.

(10) Patent No.: US 9,465,295 B2
(45) Date of Patent: Oct. 11, 2016

(54) PATTERN FORMING METHOD

(71) Applicant: Kabushiki Kaisha Toshiba, Minato-ku (JP)

(72) Inventors: Kentaro Matsunaga, Yokkaichi (JP); Masashi Terao, Yokkaichi (JP); Eiji Yoneda, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 62 days.

(21) Appl. No.: 14/193,410

(22) Filed: Feb. 28, 2014

(65) Prior Publication Data

US 2015/0168841 A1    Jun. 18, 2015

Related U.S. Application Data

(60) Provisional application No. 61/915,830, filed on Dec. 13, 2013.

(51) Int. Cl.
*H01L 21/033* (2006.01)
*G03F 7/20* (2006.01)
*G03F 7/00* (2006.01)

(52) U.S. Cl.
CPC ........... *G03F 7/2024* (2013.01); *G03F 7/0002* (2013.01)

(58) Field of Classification Search
CPC ............................. G03F 7/422; G03D 5/003
USPC .................................................. 430/324, 316
See application file for complete search history.

(56) References Cited

U.S. PATENT DOCUMENTS

| | | | | |
|---|---|---|---|---|
| 6,616,773 B1* | 9/2003 | Kuzumoto | ............... | B08B 7/00 134/1.3 |
| 8,999,631 B2* | 4/2015 | Senzaki et al. | ............... | 430/325 |
| 2005/0181630 A1* | 8/2005 | Garza | ............... | H01L 21/0273 438/781 |
| 2010/0055621 A1* | 3/2010 | Hatakeyama | ....... | H01L 21/0275 430/323 |
| 2010/0297847 A1* | 11/2010 | Cheng et al. | ............... | 438/694 |
| 2011/0183071 A1* | 7/2011 | Watanabe | ........... | H01L 21/0273 427/282 |
| 2012/0088369 A1* | 4/2012 | Weidman et al. | ............ | 438/703 |
| 2013/0196019 A1 | 8/2013 | Willson et al. | | |
| 2013/0209755 A1 | 8/2013 | Hustad et al. | | |

FOREIGN PATENT DOCUMENTS

| | | |
|---|---|---|
| JP | 2011-18778 | 1/2011 |
| JP | 2013-528664 | 7/2013 |
| JP | 2013-166934 | 8/2013 |
| WO | 2011/116223 A1 | 9/2011 |

OTHER PUBLICATIONS

Naoko Kihara, "Directed Self-Assembly Lithography Technology", Toshiba Review, vol. 67, No. 4, 2012, pp. 44-47 (with partial English translation).
Joy Y. Cheng, et al., "Simple and Versatile Methods to Integrate Directed Self-Assembly with Optical Lithography Using a Polarity-Switched Photoresist", ACSNANO, vol. 4, No. 8, 2010, pp. 4815-4823.
Naoko Kihara, et al., "Fabrication of sub-10 nm pattern using diblock copolymer", Proc. of SPIE, vol. 7271, 2009, pp. 72712T-1-72712T-7.
P. Mansky, et al., "Controlling Polymer-Surface Interactions with Random Copolymer Brushes", Science, vol. 275, Mar. 7, 1997, pp. 1458-1460.
Benjamen Rathsack, et al., "Advances in Directed Self Assembly Integration and Manufacturability at 300 mm", Proc. of SPIE, vol. 8682, 2013, pp. 86820K-1-86820K-11.

* cited by examiner

*Primary Examiner* — Daborah Chacko Davis
(74) *Attorney, Agent, or Firm* — Oblon, McClelland, Maier & Neustadt, L.L.P

(57) ABSTRACT

According to one embodiment, first a guide pattern is formed above an object to processing, and then surface modification is performed on the guide pattern. Then a solution including a block copolymer is coated over the object to processing having the guide pattern formed thereon, and the block copolymer is made to phase separate over the object to processing. Subsequently, one component of the phase-separated block copolymer is removed by development. And with the guide pattern coated with other component of the block copolymer as a mask, the object to processing is patterned.

8 Claims, 10 Drawing Sheets

PATTERN FORMING METHOD

CROSS-REFERENCE TO RELATED APPLICATIONS

This application is based upon and claims the benefit of priority from U.S. Provisional Application No. 61/915,830, filed on Dec. 13, 2013; the entire contents of which are incorporated herein by reference.

FIELD

Embodiments described herein relate generally to a pattern forming method.

BACKGROUND

A directed self-assembly (hereinafter called DSA) lithography technique is one which performs heating treatment above a substrate coated with a block copolymer that is a self-organizing material to make the block copolymer phase separate at micro-areas so as to form a regular periodic structure, thereby forming a fine pattern. At this time, a guide pattern, which is a guide for forming the fine pattern with, is formed above the substrate to be coated with the block copolymer. As the types of the guide pattern, there are a physical guide having physical recesses/protrusions formed in a resist pattern or the like above a substrate and a chemical guide having a chemical difference such as hydrophilicity/hydrophobicity provided above a substrate.

Among guide patterns that are the physical guide, there are a resist guide using a resist pattern obtained by patterning a resist film by an exposure apparatus, an SOC guide using a pattern obtained by transferring a resist pattern into an SOC (Spin on Carbon) as a film subject to processing, a TEOS guide using a hard mask such as TEOS (Tetraethoxysilane) formed by a CVD (Chemical Vapor Deposition) method, and the like.

Where a fine pattern is formed using the phase separation of DSA on the physical guide, there is generally the problem of defects called DSA errors, inferiority in CD (Critical Dimension) uniformity of phase-separated patterns, or so on, which are thought to be caused by the phase separation of DSA being nonuniform.

DETAILED DESCRIPTION

In general, according to one embodiment, a pattern forming method is provided. In this pattern forming method, first a guide pattern is formed above an object to processing, and then surface modification is performed on the guide pattern. Then, a solution including a block copolymer is coated above the object to processing having the guide pattern formed thereon, and the block copolymer is made to phase separate over the object to processing. Subsequently, one component of the phase-separated block copolymer is removed by development. And with the guide pattern coated with the other component of the block copolymer as a mask, the object to processing is patterned.

The pattern forming methods according to the embodiments will be described in detail below with reference to the accompanying drawings. The present invention is not limited to these embodiments. The cross-sectional views used in the embodiments below are schematic and may be different from actual things in relations between the thicknesses and widths of layers, ratios of the thicknesses of layers, and so on.

First Embodiment

FIGS. 1A to 1H are cross-sectional views schematically showing an example procedure of the pattern forming method according to the first embodiment. Here, the case where a fine periodic pattern is formed in the memory cell unit of a nonvolatile memory device such as an NAND-type flash memory or ReRAM (Resistive Random Access Memory) as an object to processing will be described. Holes (contact holes or via holes), a line-and-space shape wiring pattern, and the like can be cited as examples of the fine periodic pattern.

Figure 1A:
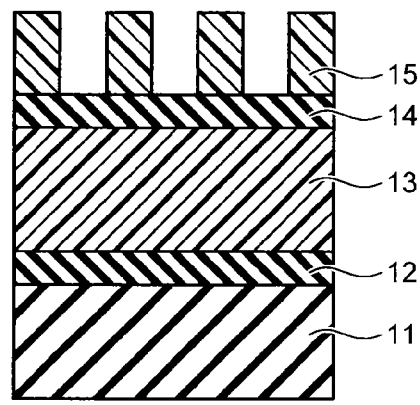
FIGS. 1A to 1H are cross-sectional views schematically showing an example procedure of the pattern forming method according to a first embodiment.

First, as shown in FIG. 1A, hard mask films 11, 12 are sequentially formed above an object to processing (not shown). The object to processing is, for example, an insulating film when holes are formed and a conductor film (or a film having an insulating film, a semiconductor film, and a metal film laid one over another) when a wiring pattern is formed. A silicon oxide film, a silicon nitride film, or the like can be used as the hard mask films 11, 12. Then, an SOC film (coated carbon film) 13 is formed on the hard mask film 12.

Subsequently, an SOG (Spin on Glass) film 14 and a resist film are sequentially formed on the SOC film 13. Then, pattern exposure is performed on the resist film by an ArF liquid immersion exposure apparatus to form a resist pattern 15. This resist pattern 15 is a guide pattern in the DSA process. The resist pattern 15 may be a hole pattern or a line-and-space pattern.

Figure 1B:
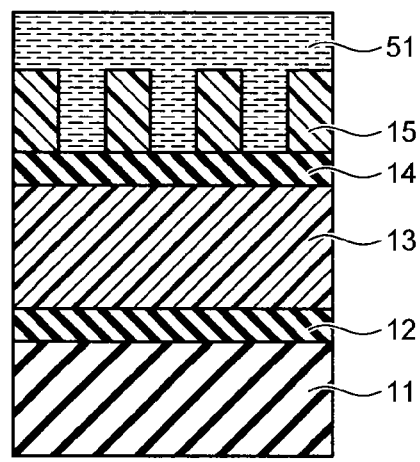

Next, as shown in FIG. 1B, surface modification is performed on the resist pattern 15 that is a guide pattern. Here, with discharging a cleaning liquid 51, washing treatment is performed on the resist pattern. The method which jets ultrapure water to a resist pattern, the method which jets functional water, the method which jets alkali aqueous solution, the method which jets acid aqueous solution, the method which jets an organic solvent or its aqueous solution or mixture, and the like can be cited as examples of the washing method.

Electrolyzed water, hydrogen water, ozone water, oxygen water, or a mixture of two or more of these can be cited as examples of the functional water.

Tetramethylammonium hydroxide (TMAH) aqueous solution, tetraethylammonium hydroxide (TEAH) aqueous solution, tetrapropylammonium hydroxide aqueous solution (TPAH), tetrabutylammonium hydroxide aqueous solution (TBAH), choline aqueous solution, ammonia water, potassium hydroxide aqueous solution, sodium hydroxide aqueous solution, or a mixture of two or more of these can be cited as examples of the alkali aqueous solution.

Dilute hydrochloric acid, dilute sulfuric acid, dilute hydrofluoric acid, phosphoric acid, nitric acid, or a mixture of two or more of these can be cited as examples of the acid aqueous solution.

Alcohols, ethers, a solvent including carboxylic acid such as acetic acid, ketones, etc., can be cited as examples of the organic solvent included in the organic solvent or its aqueous solution or mixture.

Where a positive resist is used as the resist, ultrapure water, functional water, alkali aqueous solution, and acid aqueous solution can be used. Where a negative resist is used as the resist, ultrapure water, functional water, acid aqueous solution, and the organic solvent can be used. When the acid aqueous solution is used, its concentration is desirably less than or equal to 0.1 N.

As such, by discharging ultrapure water, functional water, alkali aqueous solution, acid aqueous solution, or an organic solvent or its aqueous solution or mixture to wash the resist pattern, acids or amines that occurred in the resist pattern during pattern exposure by the ArF liquid immersion exposure apparatus can be removed.

Figure 1C:
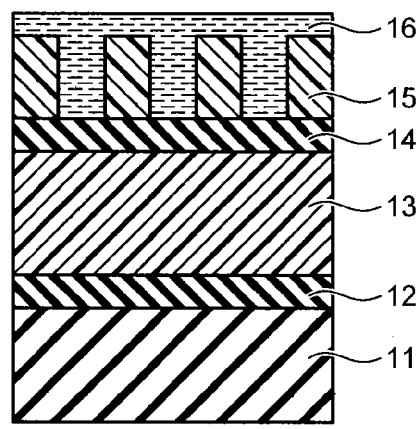

Then, as shown in FIG. 1C, a solution in which a block copolymer is dissolved is discharged to the resist pattern 15 by an ink-jet method or the like, and the substrate is spun so that a block copolymer film 16 is coated uniformly over the SOG film 14 above which the guide pattern is formed.

The block copolymer has a structure where some types of polymer chains are combined. Each polymer chain has a structure consisting of a chain of one type of monomer. The block copolymer used in the first embodiment has a structure where polymer chains having a high affinity (being hydrophilic) with the resist pattern 15 (a guide pattern) and polymer chains having a low affinity (being hydrophobic) with the resist pattern 15 are combined. Polystyrene-polymethylmethacrylate (hereinafter called Ps-b-PMMA) can be used as such a block copolymer. The molecular weight and composition of the block copolymer to be used are determined by the sizes of pattern features (hole diameters or distances between line features) to be formed in the resist pattern 15 and the sizes of pattern features (hole diameters or distances between line features) to be finally formed in the object to processing.

Instead of Ps-b-PMMA, polystyrene-poly(methyl methacrylate), polystyrene-poly(ethylene glycol), polystyrene-poly(acrylic acid), poly(ethylene glycol)-polylactide methyl ether, poly(L-lactide)-poly(ethylene glycol)methyl ether, poly(ethylene glycol) methyl ether-poly(lactide-co-glycolide), poly(ethylene glycol)-poly($\epsilon$-caprolactone) methyl ether, poly(ethylene oxide)-polycaprolactone, polystyrene-poly(ethylene glycol), poly(ethylene glycol) methyl ether-poly(D,L lactide), polypyrrole-poly(caprolactone), and the like may be used as the block copolymer. When these block copolymers are used, the molecular weight of the block copolymer and the composition ratio of the polymer chains should be changed as in the case of using Ps-b-PMMA.

Figure 1D:
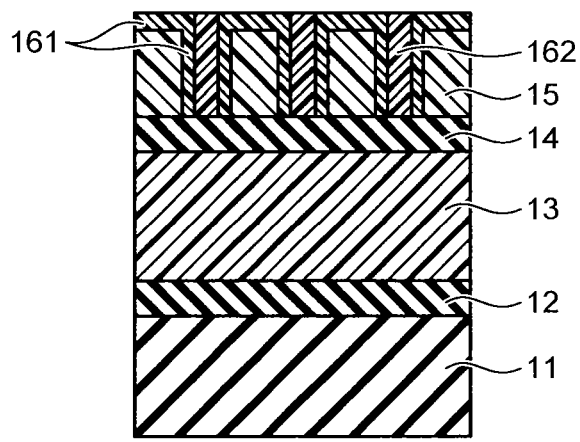

Then, the object to processing is baked with a hot plate in a nitrogen atmosphere, for example, at 240° C. for 60 sec. By this means, as shown in FIG. 1D, the same type of polymer chains of the block copolymer in the solution aggregate together to form a block (phase) of the same type of polymer chains. In this example, the resist pattern 15 functions as a physical guide, and hydrophobic polymer chains 161 aggregate together to the resist pattern 15 side. That is, hydrophobic polymer chains (Ps) 161 aggregate together at the side walls of the resist pattern 15 while hydrophilic polymer chains (PMMA) 162 aggregate together at and around the centers of the resist pattern 15, so as to self-assemble.

At this time, because acids or amines that occurred in the resist pattern 15 (a guide pattern) have been removed by washing treatment, the non-uniformity of the phase separation of DSA is suppressed, and the phase separation is uniformly performed as compared with the case where washing treatment is not performed.

Figure 1E:
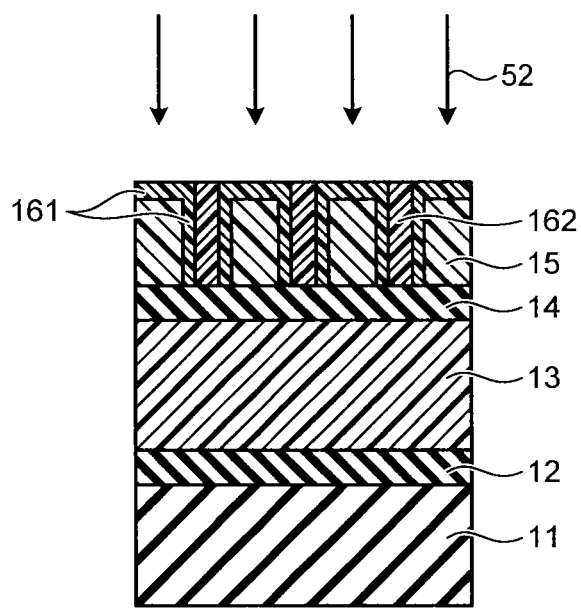

Subsequently, as shown in FIG. 1E, from among the aggregated polymer chains, hydrophilic polymer chains 162 having aggregated at and around the centers of the openings of the resist pattern 15 are selectively removed. For example, by irradiating light 52 with a wavelength of 172 nm from a $Xe_2$ excimer lamp onto the substrate, portions made of hydrophilic polymer chains (PMMA) 162 are decomposed.

Figure 1F:
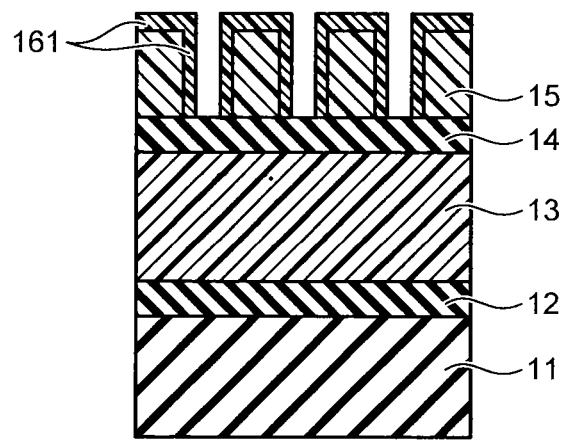

Then, developer or an organic solvent such as alcohol is discharged to the substrate to form a curved-upward liquid entity over the object to processing. Then, as shown in FIG. 1F, the organic solvent is removed by spinning it to come off, thereby removing what the hydrophilic polymer chains (PMMA) 162 have decomposed into. By this means, hydrophobic polymer chains 161 (polystyrene resin) attach to the side walls of the resist pattern 15, so that a mask pattern the sizes of whose void parts (openings) are reduced relative to the resist pattern 15 is formed.

Figure 1G:
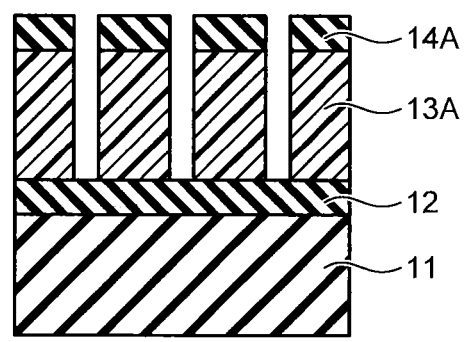

Then, as shown in FIG. 1G, with the resist pattern 15 covered by the hydrophobic polymer chains 161 as a mask, the SOG film 14 and the SOC film 13 are etched by, e.g., anisotropic etching such as dry etching. By this means, the mask pattern is transferred as mask patterns 14A, 13A into the SOG film 14 and the SOC film 13.

Figure 1H:
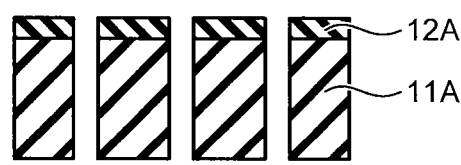

Further, as shown in FIG. 1H, with the mask patterns 14A, 13A as a mask, the hard mask films 12, 11 are etched by, e.g., anisotropic etching such as dry etching, so that the pattern is transferred as mask patterns 11A, 12A. Then, with the mask patterns 11A, 12A as a mask, the object to processing (not shown) is etched by, e.g., anisotropic etching such as dry etching. For example, holes reaching wires are formed by etching in an insulating film formed on wiring in a line-and-space pattern, or a conductor film is processed to be shaped line-and-space shape. Thereby the pattern forming method finishes.

In the first embodiment, where the guide pattern is formed by the resist pattern 15, pattern exposure is performed by the ArF liquid immersion exposure apparatus, and after development, washing treatment is performed. By this means, acids or amines that occurred in the resist pattern 15 during the exposure are removed, and out of the block copolymer coated on the resist pattern 15 thereafter, the hydrophobic polymer chains 161 can be made to attach uniformly to the resist pattern 15, thus suppressing the occurrence of non-uniform phase separation of the block copolymer. As a result, it is possible to suppress defects called DSA errors, degradation in CD uniformity of phase-separated patterns, and so on.

Further, where a hole pattern is formed, the evenness of the hole diameters after the reduction of the hole diameters of the hole pattern by the block copolymer becomes higher, resulting in the formation of a pattern without unopened holes. As a result, it is possible to also reduce production cost with increasing yield in the manufacture process of semiconductor devices.

Second Embodiment

In the first embodiment, the case where the resist pattern after exposure and development is wash-treated has been described. In the second embodiment, the case where a covering film made of a cross-linker is formed on the surface of the resist pattern after exposure and development will be described.

Figure 2A:
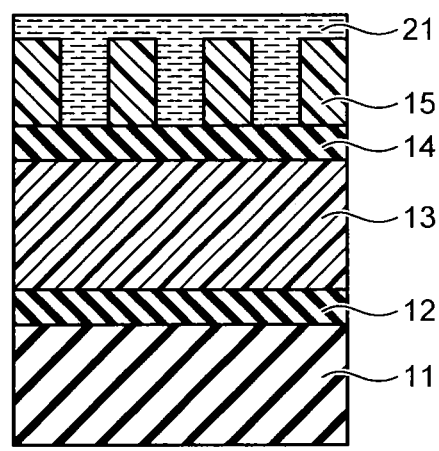
FIGS. 2A and 2B are cross-sectional views schematically showing an example procedure of the pattern forming method according to a second embodiment.
Figure 2B:
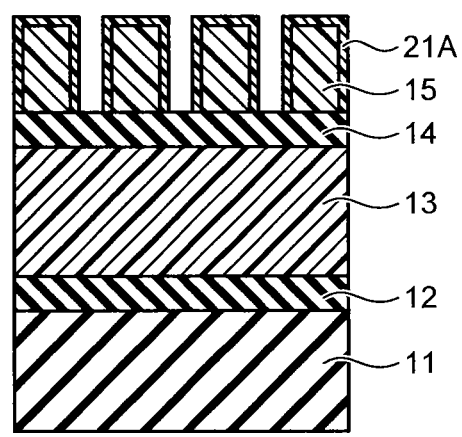

FIGS. 2A and 2B are cross-sectional views schematically showing an example procedure of the pattern forming method according to the second embodiment. First, hard mask films 11, 12, an SOC film 13, an SOG film 14, and a resist film are sequentially formed above an object to processing, and pattern exposure is performed on the resist film by an ArF liquid immersion exposure apparatus to form a resist pattern 15 to be a guide pattern. This formed pattern may be a hole pattern or a line-and-space pattern. This process is the same as the process described with FIG. 1A of the first embodiment.

Next, by way of surface modification, a cross-link film is formed on the resist pattern 15 that is a guide pattern. Specifically, as shown in FIG. 2A, a chemical solution 21 including the cross-linker is coated on the resist pattern 15, and heating treatment is performed. As the cross-linker, for example, methylated melamine resins expressed by the following formulas (1) and (2), methylated urea resins expressed by the following formulas (3) to (5), or the like can be used.

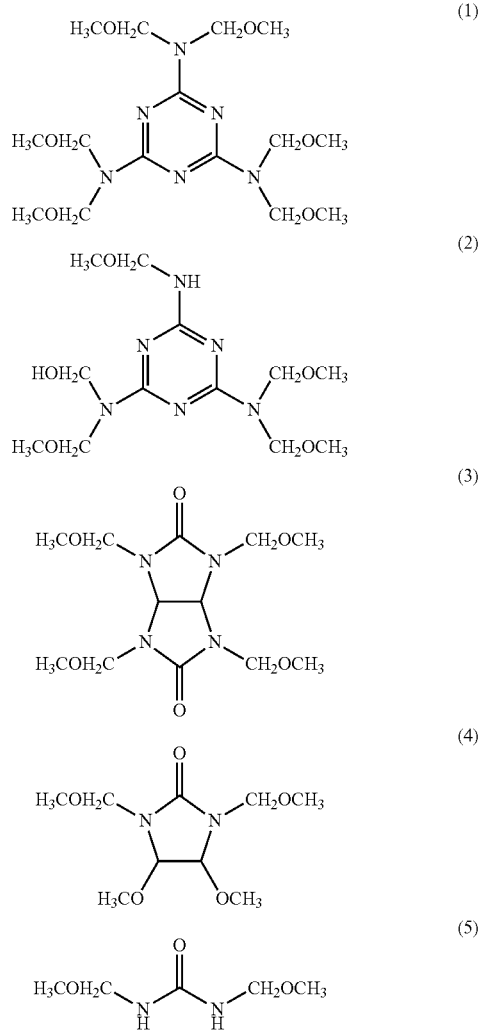

After the heating treatment, as shown in FIG. 2B, parts of the cross-linker that have not cross-linked are removed. Then, washing treatment with an organic solvent or alkali aqueous solution may be performed. By this means, a cross-link film 21A is formed on the surface of the resist pattern 15.

For example, in the case of a positive resist, although hydroxyl groups exist in the surface of the resist pattern 15 after exposure and development, by forming the cross-link film 21A, the hydroxyl groups combine with polymers forming the cross-link film 21A, so that a state where hydroxyl groups do not exist in the surface of the resist pattern 15 can be created. As a result, the block copolymer, which will be coated later, can be coated uniformly over the resist pattern 15 covered by the cross-link film 21A.

Subsequently, the same process as in FIG. 10 and later of the first embodiment is performed.

In the second embodiment, in the case that the guide pattern is to be constituted by the resist pattern 15, pattern exposure is performed by an ArF liquid immersion exposure apparatus, and after development, the cross-linker is coated on the resist pattern 15 to form the cross-link film 21A. By this means, the surface of the resist pattern 15 is modified, so that the same effect as in the first embodiment can be obtained.

Third Embodiment

In the second embodiment, the case where a covering film made of a cross-linker is formed on the surface of the resist pattern after exposure and development has been described. In the third embodiment, the case where a covering film is formed on the surface of the resist pattern after exposure and development will be described.

Figure 3:
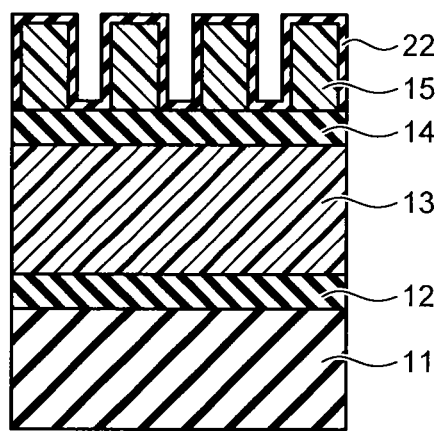
FIG. 3 is a cross-sectional view schematically showing an example procedure of the pattern forming method according to a third embodiment.

FIG. 3 is a cross-sectional view schematically showing an example procedure of the pattern forming method according to the third embodiment. First, hard mask films 11, 12, an SOC film 13, an SOG film 14, and a resist film are sequentially formed above an object to processing, and pattern exposure is performed on the resist film by an ArF liquid immersion exposure apparatus to form a resist pattern 15 to be a guide pattern. This formed pattern may be a hole pattern or a line-and-space pattern. This process is the same as the process described with FIG. 1A of the first embodiment.

Next, as shown in FIG. 3, a surface modification film 22 is formed on the surface of the resist pattern 15 that is a guide pattern. This surface modification film 22 is desirably a film that can cover the surface of the resist pattern 15 in a conformal manner. As the surface modification film 22, an insulating film, semiconductor film, or metal film with about 5 to 10 nm thickness can be used. For example, an SiN film, SiON film, $SiO_2$ film, SiC film, a-Si film, carbon film, Ti film (Ti-based alloy film), W film (W-based alloy film), etc., can be used. Such a surface modification film 22 can be formed by a low-temperature CVD method, ALD (Atomic Layer Deposition) method, or the like, which can form the film at a temperature lower than or equal to a temperature (250° C.) at which the resist pattern 15 does not deform.

The surface of this surface modification film 22 is uniform in composition as compared with the surface of the resist pattern 15, and the block copolymer, which will be coated later, can be made to attach uniformly thereto.

Subsequently, the same process as in FIG. 1C and later of the first embodiment is performed.

In the third embodiment, in the case that the guide pattern is to be constituted by the resist pattern 15, pattern exposure is performed by an ArF liquid immersion exposure apparatus, and after development, the surface modification film 22 constituted by an insulating film, semiconductor film, or metal film is formed on the resist pattern 15. By this means, the surface modification film 22 relatively uniform in composition is formed on the surface of the resist pattern 15, so that the same effect as in the first embodiment can be obtained.

Fourth Embodiment

In the first embodiment, the case where the resist pattern after exposure and development is wash-treated with liquid has been described. In the fourth embodiment, the case where the surface of the resist pattern after exposure and development is exposed to oxidizing gas to perform surface modification will be described.

Figure 4:
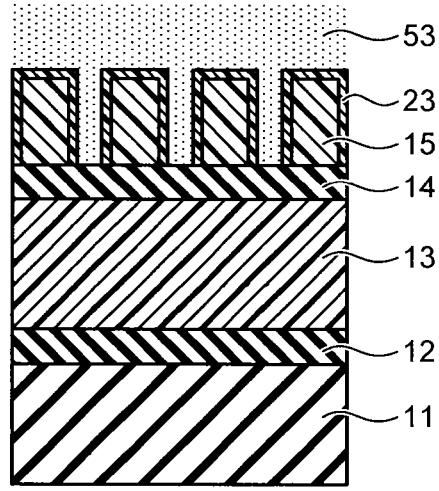
FIG. 4 is a cross-sectional view schematically showing an example procedure of the pattern forming method according to a fourth embodiment.

FIG. 4 is a cross-sectional view schematically showing an example procedure of the pattern forming method according to the forth embodiment. First, hard mask films 11, 12, an SOC film 13, an SOG film 14, and a resist film are sequentially formed above an object to processing, and pattern exposure is performed on the resist film by an ArF liquid immersion exposure apparatus to form a resist pattern 15 to be a guide pattern. This formed pattern may be a hole pattern or a line-and-space pattern. This process is the same as the process described with FIG. 1A of the first embodiment.

Next, as shown in FIG. 4, the surface of the resist pattern 15 that is a guide pattern is exposed to oxidizing gas 53 to perform surface modification. Specifically, after the resist pattern 15 is formed, the object to processing is exposed to an oxidizing gas atmosphere for a predetermined time. As the oxidizing gas 53, ozone, oxygen gas, chlorine gas, bromine gas, fluorine gas, etc., can be used. Note that while the resist pattern 15 is exposed to the oxidizing gas 53, the object to processing (the substrate) may be heated to a temperature as low as the resist pattern 15 does not deform.

By this means, the surface of the resist pattern 15 is oxidized, so that an oxide film 23 is formed. As a result, the surface of the resist pattern 15 becomes more uniform in composition than before the oxidization treatment. Because the surface of the resist pattern 15 becomes smooth by performing the treatment in an oxygen atmosphere, it is desirable to perform the treatment in an oxygen atmosphere.

Subsequently, the same process as in FIG. 1C and later of the first embodiment is performed.

In the fourth embodiment, in the case that the guide pattern is to be constituted by the resist pattern 15, pattern exposure is performed by an ArF liquid immersion exposure apparatus, and after development, the resist pattern 15 is exposed to an oxidizing gas atmosphere to modify the surface of the resist pattern 15. Thus, the same effect as in the first embodiment can be obtained.

Fifth Embodiment

Although in the first to fourth embodiments the case where the physical guide is constituted by a resist pattern is cited as an example, the surface modification shown in the first to fourth embodiments can be applied also to the case where a resist pattern is transferred into an SOC pattern to be used as the physical guide or the case where a pattern transferred into a hard mask such as TEOS, amorphous silicon, SiCN, or SiN is used as the physical guide.

Figure 5A:
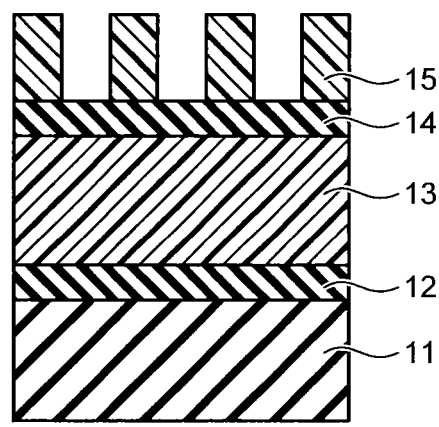
FIGS. 5A to 5H are cross-sectional views schematically showing an example procedure of the pattern forming method according to a fifth embodiment.

FIGS. 5A to 5H are cross-sectional views schematically showing an example procedure of the pattern forming method according to the fifth embodiment. First, as shown in FIG. 5A, hard mask films 11, 12, an SOC film 13, an SOG film 14, and a resist film are sequentially formed on an object to processing (not shown), and pattern exposure is performed on the resist film by an ArF liquid immersion exposure apparatus to form a resist pattern 15. This formed pattern may be a hole pattern or a line-and-space pattern.

Figure 5B:
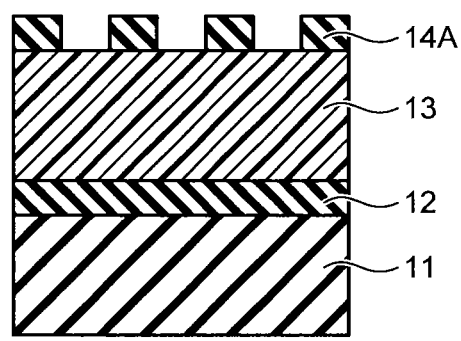

Then, as shown in FIG. 5B, with the resist pattern 15 as a mask, the SOG film 14 is etched by, e.g., anisotropic etching such as dry etching to form a mask pattern 14A.

Figure 5C:
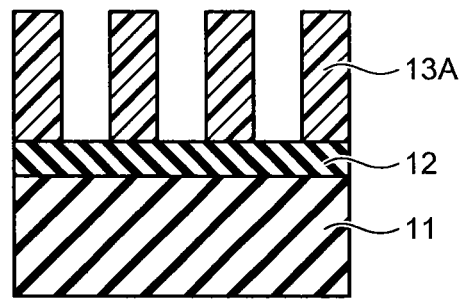

Further, as shown in FIG. 5C, with the mask pattern 14A as a mask, the SOC film 13 is etched by, e.g., anisotropic etching such as dry etching to form a mask pattern 13A. The mask pattern 13A constituted by the SOC film is a guide pattern.

Figure 5D:
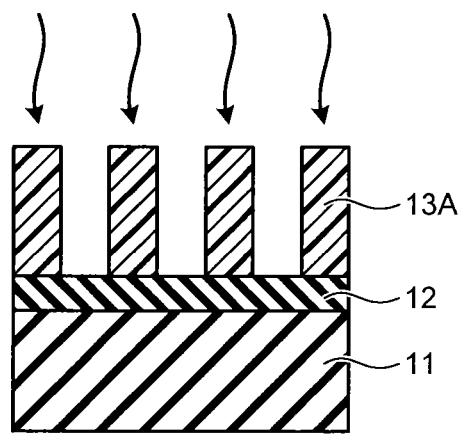

Then, as shown in FIG. 5D, surface modification is performed on the guide pattern 13A. For the surface modification, the method which washes shown in the first embodiment, the method which coats a cross-linker shown in the second embodiment, the method which forms a surface modification film shown in the third embodiment, the method which exposes to oxidizing gas shown in the fourth embodiment, etc., can be used.

Figure 5E:
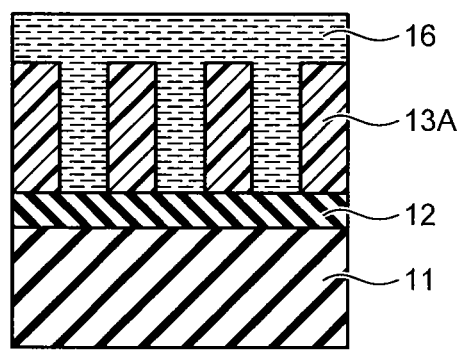

Then, as shown in FIG. 5E, a solution in which a block copolymer is dissolved is discharged to the guide pattern by an ink-jet method or the like, and the substrate is spun so that a block copolymer film 16 is coated uniformly over the hard mask film 12 on which the guide pattern is formed. As the block copolymer, those shown in the first embodiment can be used. Here, Ps-b-PMMA is used.

Figure 5F:
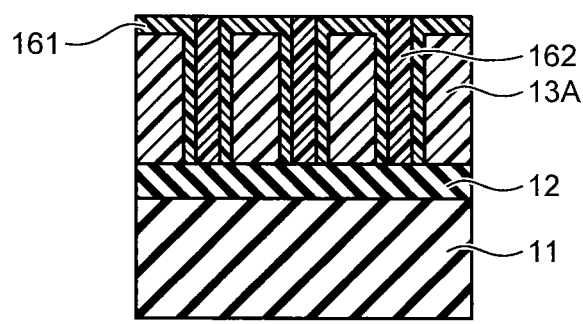

Then, the object to processing is baked with a hot plate in a nitrogen atmosphere, for example, at 240° C. for 60 sec. By this means, as shown in FIG. 5F, the same type of polymer chains of the block copolymer in the solution aggregate together to form a block (phase) of the same type of polymer chains. In this example, the mask pattern 13A functions as a physical guide, and hydrophobic polymer chains 161 aggregate together to the mask pattern 13A side. That is, hydrophobic polymer chains (Ps) 161 aggregate together at the side walls of the mask pattern 13A while hydrophilic polymer chains (PMMA) 162 aggregate together at and around the centers of the openings of the mask pattern 13A, so as to self-assemble.

Figure 5G:
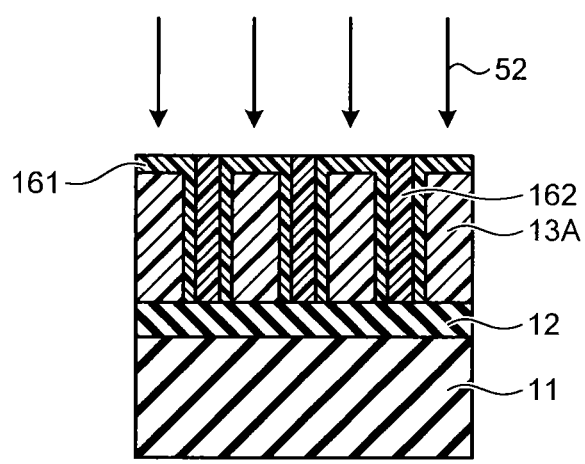

Subsequently, as shown in FIG. 5G, from among the aggregated polymer chains, hydrophilic polymer chains 162 having aggregated at and around the centers of the openings of the mask pattern 13A are selectively removed. For example, by irradiating light 52 with a wavelength of 172 nm from a $Xe_2$ excimer lamp onto the substrate, portions made of hydrophilic polymer chains (PMMA) 162 are decomposed.

Figure 5H:
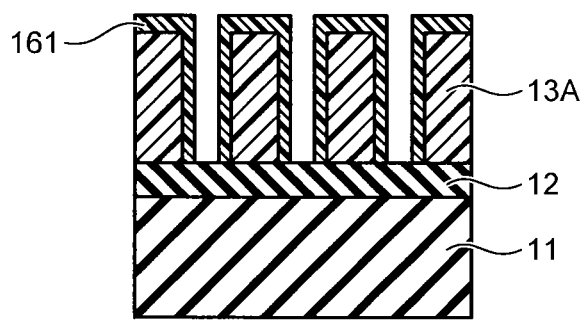

Then, as shown in FIG. 5H, developer or an organic solvent such as alcohol is discharged to the substrate to form a curved-upward liquid entity over the object to processing. Then, the organic solvent is removed by spinning it to come off, thereby removing what the hydrophilic polymer chains (PMMA) 162 have decomposed into. By this means, hydrophobic polymer chains 161 (polystyrene resin) attach to the side walls of the mask pattern 13A, so that a mask pattern the sizes of whose void parts (openings) are reduced relative to the mask pattern 13A is formed.

Then, as shown in FIG. 1H of the first embodiment, with the mask pattern (SOC film) 13A covered by the hydrophobic polymer chains 161 as a mask, the hard mask films 12, 11 are etched by, e.g., anisotropic etching such as dry etching to form mask patterns 12A, 11A. Then, with the mask patterns 12A, 11A as a mask, the object to processing (not shown) is etched by, e.g., anisotropic etching such as dry etching. Thereby the pattern forming method finishes.

Figure 6A:
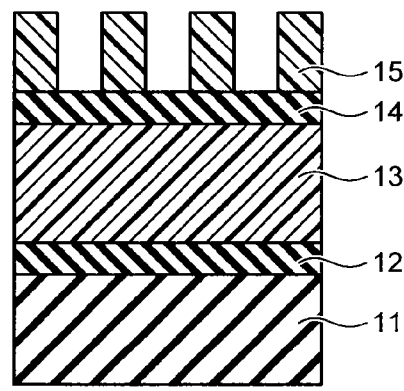
FIGS. 6A to 6H are cross-sectional views schematically showing another example procedure of the pattern forming method according to the fifth embodiment.

FIGS. 6A to 6H are cross-sectional views schematically showing another example procedure of the pattern forming method according to the fifth embodiment. First, as shown in FIG. 6A, hard mask films 11, 12, an SOC film 13, an SOG film 14, and a resist film are sequentially formed above an object to processing (not shown), and pattern exposure is performed on the resist film by an ArF liquid immersion exposure apparatus to form a resist pattern 15. This formed pattern may be a hole pattern or a line-and-space pattern. As the hard mask film 11, a silicon oxide film, silicon nitride film, or the like can be used. As the hard mask film 12, a TEOS film, amorphous silicon film, SiCN film, silicon nitride film, or the like can be used.

Figure 6B:
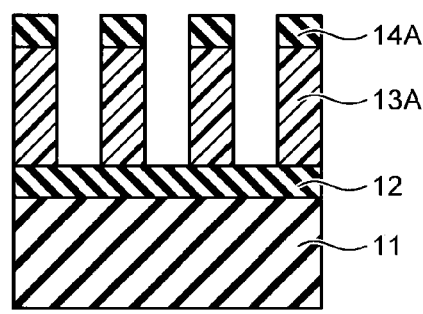

Then, as shown in FIG. 6B, with the resist pattern 15 as a mask, the SOG film 14 and SOC film 13 are etched by, e.g., anisotropic etching such as dry etching to form mask patterns 14A, 13A.

Figure 6C:
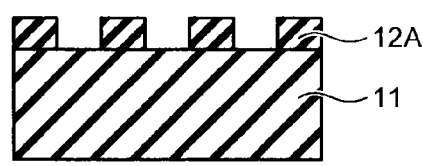

Further, as shown in FIG. 6C, with the mask patterns 14A, 13A as a mask, the hard mask film 12 is etched by, e.g., anisotropic etching such as dry etching to form a mask pattern 12A. The mask pattern 12A constituted by the hard mask film 12 is a guide pattern.

Figure 6D:
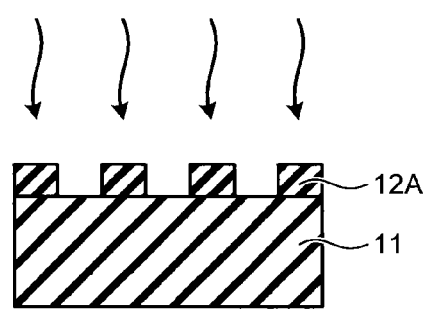

Then, as shown in FIG. 6D, surface modification is performed on the guide pattern 12A. For the surface modification, the method which washes shown in the first embodiment, the method which coats a cross-linker shown in the second embodiment, the method which forms a surface modification film shown in the third embodiment, the method which exposes to oxidizing gas shown in the fourth embodiment, etc., can be used. Where the method which coats a cross-linker shown in the second embodiment is applied to the guide pattern constituted by the hard mask film 12, the same effect as with the method which forms a surface modification film shown in the third embodiment is obtained.

Figure 6E:
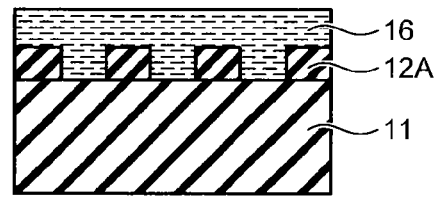

Then, as shown in FIG. 6E, a solution in which a block copolymer is dissolved is discharged to the guide pattern by an ink-jet method or the like, and the substrate is spun so that a block copolymer film 16 is coated uniformly over the hard mask film 11 on which the guide pattern is formed. As the block copolymer, those shown in the first embodiment can be used. Here, Ps-b-PMMA is used.

Figure 6F:
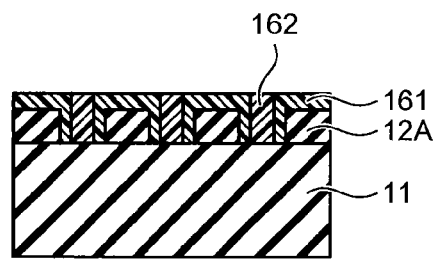

Then, the object to processing is baked with a hot plate in a nitrogen atmosphere, for example, at 240° C. for 60 sec. By this means, as shown in FIG. 6F, the same type of polymer chains of the block copolymer in the solution aggregate together to form a block (phase) of the same type of polymer chains. In this example, the mask pattern 12A functions as a physical guide, and hydrophobic polymer chains 161 aggregate together to the mask pattern 12A side. That is, hydrophobic polymer chains (Ps) 161 aggregate together at the side walls of the mask pattern 12A while hydrophilic polymer chains (PMMA) 162 aggregate together at and around the centers of the openings of the mask pattern 12A, so as to self-assemble.

Figure 6G:
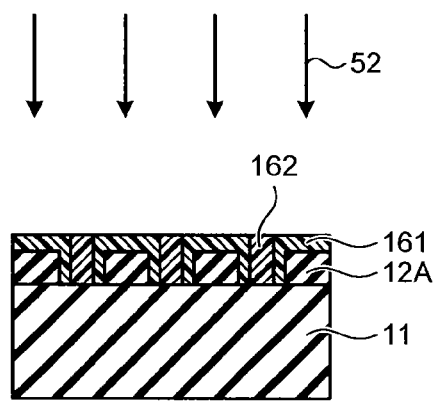

Subsequently, as shown in FIG. 6G, from among the aggregated polymer chains, hydrophilic polymer chains 162 having aggregated at and around the centers of the mask pattern 12A are selectively removed. For example, by irradiating light 52 with a wavelength of 172 nm from a $Xe_2$ excimer lamp onto the substrate, portions made of hydrophilic polymer chains (PMMA) 162 are decomposed.

Figure 6H:
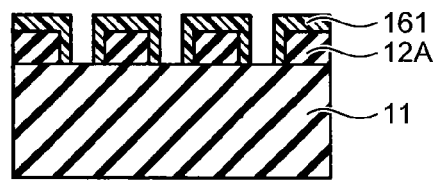

Then, as shown in FIG. 6H, developer or an organic solvent such as alcohol is discharged to the substrate to form a curved-upward liquid entity over the object to processing. Then, the organic solvent is removed by spinning it to come off, thereby removing what the hydrophilic polymer chains (PMMA) 162 have decomposed into. By this means, hydrophobic polymer chains 161 (polystyrene resin) attach to the side walls of the mask pattern 12A, so that a mask pattern the sizes of whose void parts (openings) are reduced relative to the mask pattern 12A is formed.

Then, as in the procedure shown in FIG. 1H and later of the first embodiment, with the mask pattern (hard mask film) 12A covered by the hydrophobic polymer chains 161 as a mask, the hard mask film 11 is etched by, e.g., anisotropic etching such as dry etching to form a mask pattern 11A. Then, with the mask patterns 12A, 11A as a mask, the object to processing (not shown) is etched by, e.g., anisotropic etching such as dry etching. Thereby the pattern forming method finishes.

In the fifth embodiment, even where a layer other than the resist pattern 15 is used as the guide pattern, surface modification is performed on the guide pattern after the guide pattern is formed. Thereby the surface of the guide pattern is modified. For example, during the forming process of the guide pattern or after the guide pattern is formed, the substrate remains in the same atmosphere, and by the surface modification, contaminations from the environment attaching to the guide pattern are removed, or reaction with contaminations attaching to the guide pattern is induced, so that the influence of them can be nullified. Then, out of the block copolymer coated over the object to processing having the guide pattern formed thereon, the hydrophobic polymer chains 161 can be made to attach uniformly to the guide pattern, thus suppressing the occurrence of nonuniform phase separation of the block copolymer. As a result, it is possible to suppress defects called DSA errors, degradation in CD uniformity of phase-separated patterns, and so on.

Further, where a hole pattern is formed, the evenness of the hole diameters after the reduction of the hole diameters of the hole pattern by the block copolymer becomes higher, resulting in the formation of a pattern without unopened holes. As a result, it is possible to also reduce the effect that production cost with increasing yield in the manufacture process of semiconductor devices.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A pattern forming method, comprising:
    forming a guide pattern above an object to be processed;
    performing surface modification on the guide pattern;
    coating a solution including a block copolymer over the object to be processed having the guide pattern formed thereon;
    making the block copolymer phase separate over the object to be processed;
    removing one component of the phase-separated block copolymer by development; and
    patterning, by anisotropic etching, the object to be processed with the guide pattern covered by another component of the block copolymer as a mask, wherein the performing surface modification includes washing a surface of the guide pattern with functional water, the functional water being water containing a material that is obtained by the electrolysis of water having a dissolved electrolyte therein, or water in which gas is dissolved at a concentration higher than a concentration that the gas is dissolved in water at normal condition.

2. The pattern forming method according to claim 1, wherein the guide pattern is a resist pattern.

3. The pattern forming method according to claim 1, wherein the forming of the guide pattern includes
   forming a spin on carbon (SOC) film on the object to be processed;
   forming a resist pattern on the SOC film; and
   patterning, by anisotropic etching, the SOC film with the resist pattern as a mask to form the guide pattern constituted by the SOC film.

4. The pattern forming method according to claim 1, wherein the forming of the guide pattern includes
   forming a hard mask film on the object to be processed;
   forming a resist pattern on the hard mask film; and
   patterning, by anisotropic etching, the hard mask film with the resist pattern as a mask to form the guide pattern constituted by the hard mask film.

5. The pattern forming method according to claim 1, wherein
   the guide pattern is made of a hydrophilic material, and
   the block copolymer has hydrophilic polymer chains and hydrophobic polymer chains.

6. The pattern forming method according to claim 1, wherein the guide pattern is a line-and-space pattern or a hole pattern.

7. The pattern forming method according to claim 1, wherein the block copolymer is at least one selected from a group consisting of polystyrene-polymethylmethacrylate, polystyrene-poly(methyl methacrylate), polystyrene-poly(ethylene glycol), polystyrene-poly(acrylic acid), poly(ethylene glycol)-polylactide methyl ether, poly(L-lactide)-poly(ethylene glycol)methyl ether, poly(ethylene glycol) methyl ether-poly(lactide-co-glycolide), poly(ethylene glycol)-poly(ε-caprolactone) methyl ether, poly(ethylene oxide)-polycaprolactone, polystyrene-poly(ethylene glycol), poly(ethylene glycol) methyl ether-poly(D,L lactide), and polypyrrole-poly(caprolactone).

8. The pattern forming method according to claim 1, wherein the functional water is at least one selected from a group consisting of electrolyzed water, hydrogen water, ozone water, and oxygen water.

\* \* \* \* \*